United States Patent
McClure et al.

(10) Patent No.: US 7,109,635 B1
(45) Date of Patent: Sep. 19, 2006

(54) WAFER LEVEL PACKAGING OF MATERIALS WITH DIFFERENT COEFFICIENTS OF THERMAL EXPANSION

(75) Inventors: Michael T. McClure, Winter Park, FL (US); Jack Chocola, Lake Mary, FL (US); Kevin K. Lin, Apopka, FL (US); George Grama, Oviedo, FL (US)

(73) Assignee: Sawtek, Inc., Orlando, FL (US)

( * ) Notice: Subject to any disclaimer, the term of this patent is extended or adjusted under 35 U.S.C. 154(b) by 109 days.

(21) Appl. No.: 10/867,172

(22) Filed: Jun. 14, 2004

Related U.S. Application Data (60) Provisional application No. 60/477,576, filed on Jun. 11, 2003.

(51) Int. Cl.
*H01L 41/08* (2006.01)

(52) U.S. Cl. .................. 310/313 R; 310/340; 310/344

(58) Field of Classification Search ............ 310/313 R, 310/340, 344, 348
See application file for complete search history.

(56) References Cited

U.S. PATENT DOCUMENTS

| | | | |
|---|---|---|---|
| 6,078,123 A * | 6/2000 | Tanaka et al. | 310/313 R |
| 6,225,692 B1 | 5/2001 | Hinds | |
| 6,467,139 B1 * | 10/2002 | Tanaka | 29/25.35 |
| 6,495,383 B1 | 12/2002 | Lyu | |
| 6,495,398 B1 | 12/2002 | Goetz | |
| 6,498,387 B1 | 12/2002 | Yang | |
| 6,507,097 B1 | 1/2003 | Goetz et al. | |
| 6,635,509 B1 | 10/2003 | Ouellet | |
| 6,660,564 B1 | 12/2003 | Brady | |
| 6,900,709 B1 * | 5/2005 | Inoue | 333/193 |

OTHER PUBLICATIONS

T. Glinsner, V. Dragoi, C. Thanner, G. Millendorfer, P. Lindner, C. Schaefer; Wafer Bonding Using BCB and SU-8 Intermediate Layers for MES Applications; pp. 1-4; Presented at SEMICON Taiwan; 2002.

Frank Niklaus, Peter Enoksson, Edvard Kalvesten, Goran Stemme; "Low-Temperature Full Wafer Adhesive Bonding"; Journal of Micromechanics and Microengineering; Mar. 28, 2000; pp. 100-107.

* cited by examiner

*Primary Examiner*—Mark Budd
(74) *Attorney, Agent, or Firm*—Allen, Dyer, Doppelt, Milbrath & Gilchrist, P.A.

(57) ABSTRACT

An electro-mechanical device package includes a cap material permanently bonded to a device wafer encapsulating an electromechanical device. An intermediate material is used to bond the device and capping material together at a low temperature, and a structure including the intermediate material emanating from either the device or cap material, or both, provides an interlocking at the bonding interface. One package includes a reusable carrier wafer with a similar coefficient of thermal expansion as a mating material and a low cost cap wafer of different material than the device wafer. A method for temporarily bonding the cap material to the carrier wafer includes attaching the cap material to the carrier wafer and is then singulated to mitigate thermal expansion mismatch with the device wafer.

26 Claims, 9 Drawing Sheets

WAFER LEVEL PACKAGING OF MATERIALS WITH DIFFERENT COEFFICIENTS OF THERMAL EXPANSION

CROSS REFERENCE TO RELATED APPLICATION

This application claims priority to the Provisional Applications having Ser. No. 60/477,576 and filing date Jun. 11, 2003 for "Wafer Level Packaging of Materials with Different Coefficients of Thermal Expansion," the disclosure of which is herein incorporated by reference in their entirety, and commonly owned.

FIELD OF THE INVENTION

The invention generally relates to surface acoustic wave (SAW) devices, bulk acoustic wave (BAW) devices, microelectromechnical system (MEMS) devices, and opto-electronic devices, and more particularly to a wafer-scale package and method of manufacturing.

BACKGROUND

Surface acoustic wave (SAW) and micro-electromechanical (MEMS) devices, by way of example, are in a subgroup of electronic devices where the active area must move freely for proper functioning of the device. By way of example, a surface acoustic wave (SAW) resonator typically includes transducers and reflectors disposed upon a piezoelectric substrate. The transducer is made up of interdigital electrodes of metal such as aluminium, copper, magnesium or metal alloy. Lithium tantalate, lithium niobate and quartz are commonly used piezoelectric substrates for SAW devices. When an RF electric field is applied across the input transducer, acoustic waves are generated and travel along a top surface of the piezoelectric substrate. These waves are detected and processed by the interdigital electrodes to provide a filtering device. A space above an active region of the SAW device is needed to avoid dampening the propagation of the surface acoustic waves. To provide environmental protection, these devices are hermetically sealed into a cavity of a ceramic package. Electrical connections to the SAW devices may be made through interconnects embedded in the ceramic package. Such an approach can result in stacked measurements or tolerances that include the thickness of the outer package, the gap between a device wafer and the bottom of the package, the thickness of the device wafer, the gap between the device wafer and the lid, and the lid itself. There is a technological desire to reduce the overall package height and maintain low cost. One consideration is to eliminate the ceramic package.

Integrated circuit packaging typically achieves minimal package height by using an epoxy that covers the device to provide environmental and mechanical protection. This approach is not practical for the SAW and MEMS devices as the epoxy material would completely cover the device and impede proper functioning. However, wafer bonding technologies have been widely used in the MEMS arena, and to a limited extent in the SAW device field, to create a cavity around the active area. Given that most bonding techniques take place at temperatures above room temperature, the resulting effects of a coefficient of thermal expansion (CTE) of the device material and the cap material must be matched or mitigated. Matching the CTE typically means using the same material for both the cap and the device.

Since the cap material does not require the same acoustic properties as the substrate, a lower cost material may be used if the material bonding technique and preparation can accommodate the thermal expansion mismatch. This approach is not practical for certain devices of interest as the epoxy material would completely cover the device and impede the desired function. An effect of bonding the cap material to the device material with different thermal coefficient of expansions results in a misalignment of wafers. By way of example, while alignment marks for the cap material and the device wafer are aligned at room temperature, at an elevated bonding temperature, due to the different physical expansion of the two substrates, a misalignment and off-registry of the alignment results.

SUMMARY

To address the need for a smaller package height at a low cost, one embodiment of the present invention provides a wafer bonding method and resulting package. To neutralize the thermal expansion mismatch, either the device wafer or the capping material may be reversibly bonded to a carrier wafer that has a similar coefficient of thermal expansion to the other material. By way of example, if the carrier wafer and the device wafer have similar thermal expansion behavior, then the capping or cap material may be bonded to the carrier wafer. The material that is reversibly bonded to the carrier wafer may then be made into individual components and separated from each other, or "singulated", prior to permanently bonding to the mating material. When a carrier wafer assembly is heated to the permanent bonding temperature, the carrier wafer expands to the same dimensions as the mating material ensuring proper registry of device and cap at the interior and periphery alike. The expansion of each singulated component may be controlled by the expansion of the carrier wafer as transferred through the reversible bonding medium. After permanently bonding the capping material and device wafer together, the carrier wafer is removed and may be reused, thus eliminating the need to repurchase carrier wafers.

The use of the carrier wafer may further reduce the total package height by allowing the reversibly bonded material to be thinned by conventional means, such as chemical mechanical polishing (CMP) or etching. After thinning the attached material, the carrier wafer acts as a mechanical support through further processing. One extension of this approach may include reversibly bonding both the cap material and the device wafer for allowing both components to be thinned and the thermal expansion controlled.

One method aspect of the invention directed to fabricating a wafer level package may comprise providing a device wafer having a device carried on a surface thereof, selecting a carrier wafer formed of a material having a similar coefficient of thermal expansion as the device wafer, and applying a temporary bonding material to a first surface of the carrier wafer. A cap material is provided and reversibly bonded to the carrier wafer for forming a cap assembly. Pattern alignment elements may be placed onto the cap assembly and the device wafer. An adhesive material is deposited onto opposing surfaces of the cap material and device wafer, and the cap material is singulated for forming an individual cap that is temporarily bonded to the carrier wafer. The cap assembly is aligned with the device wafer using the pattern alignment elements, and bonded to the device wafer. The carrier wafer is released from the cap assembly. At least a portion of the carrier and cap assembly are covered with a dielectric overcoat, and an electrical contact is provided. Alternatively, one method of fabricating the wafer level package may comprise selecting a carrier wafer formed of a material having a similar coefficient of thermal expansion as the cap material and applying a temporary bonding material to a first surface of the carrier wafer for reversibly bonding the carrier wafer to the device wafer.

BRIEF DESCRIPTION OF DRAWINGS

For a fuller understanding of the invention, reference is made to the following detailed description, taken in connection with the accompanying drawings illustrating various embodiments of the present invention, in which.

DETAILED DESCRIPTION OF EMBODIMENTS

The present invention will now be described more fully with reference to the accompanying drawings in which alternate embodiments of the invention are shown and described. It is to be understood that the invention may be embodied in many different forms and should not be construed as limited to the illustrated embodiments set forth herein. Rather, these embodiments are provided so that this disclosure may be thorough and complete, and will convey the scope of the invention to those skilled in the art.

Figure 1:
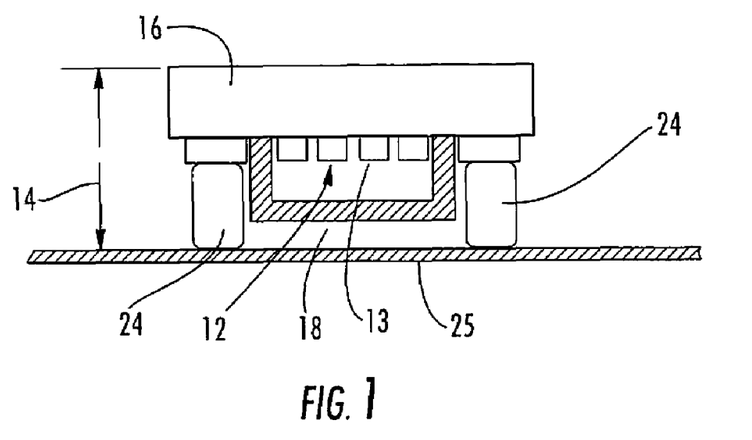
FIG. 1 is a partial elevation and cross-sectional view of a wafer-level package in keeping with the teachings of the present invention.
Figure 1A:
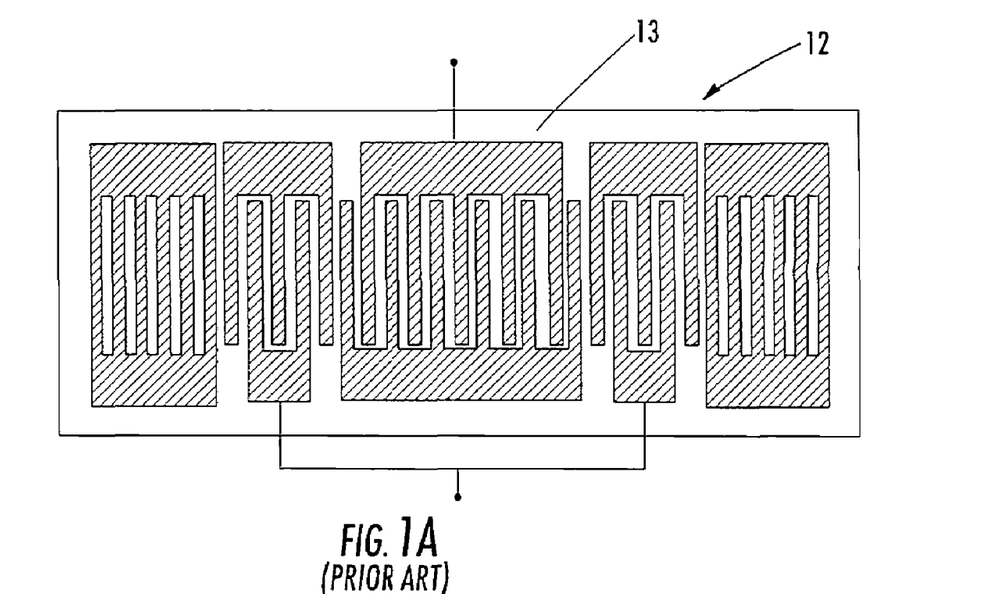
FIG. 1A is a top plan view illustrating a typical SAW device.
Figure 2:
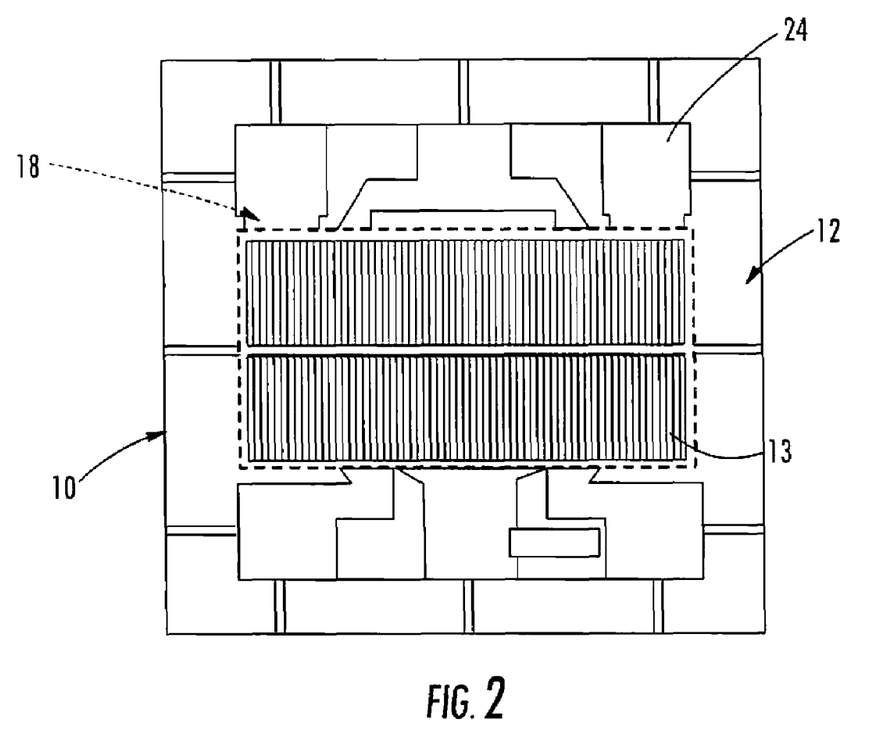
FIG. 2 is a plan view of a SAW device illustrated without the cap covering the device for a viewing thereof.
Figure 3:
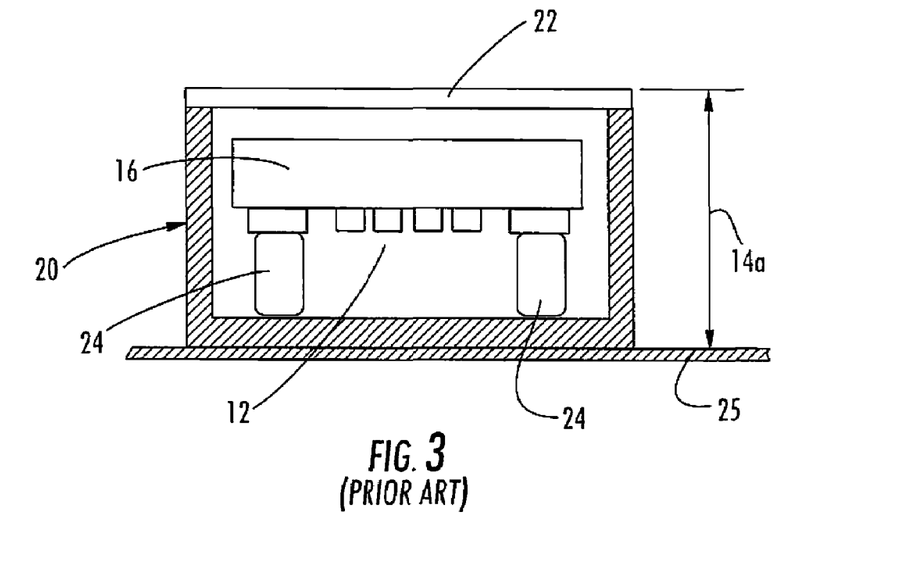
FIG. 3 is a partial elevation and cross-sectional view illustrating a typical device package.

With reference initially to FIGS. 1 and 2, a wafer-level package 10 for a device 12, such as a SAW having a transducer 13, or MEMS device by way of another example, may be constructed to overcome problems associated with using materials having differing thermal coefficients of expansion (CTE) regardless of the package type desired for a particular use. By way of example, it may be desirable to minimize a height dimension 14 of the package 10 by making a device material or wafer 16 part of the package, as illustrated with reference to FIGS. 1 and 2, wherein a cap material or cap 18 is bonded to the device wafer 16 for encapsulating the device 12, as opposed to encapsulating the device within a ceramic package 20 and lid 22, thus reducing a height 14A to the height 14, as illustrated with reference to FIG. 3. By way of example and with reference to FIG. 1A, a surface acoustic wave (SAW) resonator 12 typically includes transducers and reflectors disposed upon a piezoelectric substrate. The transducer 13 is made up of interdigital electrodes of metal such as aluminium, copper, magnesium or metal alloy. Lithium tantalate, lithium niobate and quartz are commonly used piezoelectric substrates for SAW devices. When an RF electric field is applied across the input transducer, acoustic waves are generated and travel along a top surface of the piezoelectric substrate. These waves are detected and processed by the interdigital electrodes to provide a filtering device. A space above an active region of the SAW device 12 is needed to avoid dampening the propagation of the surface acoustic waves. To provide environmental protection, these devices are hermetically sealed into a cavity of a ceramic package. Electrical connections may be made to the SAW devices through interconnects electrical interconnects 24 connected directly to a printed circuit board (PCB) 25 as appropriate for the circuits desired.

Those skilled in the art appreciate that using a low cost material for the cap 18 generally implies a difference in coefficient of thermal expansion (CTE) between the device wafer 16 and the material forming the cap 18. By way of example, lithium tantalate has a CTE of 17 ppm/K while silicon has a CTE of 2.6 ppm/K. If the cap material, comprising a silicon wafer, is bonded at 150 degrees above room temperature to a device wafer, comprising lithium tantalate, the difference in thermal expansion creates a dimensional difference on the order of 100 microns that is approximately 10% of a device size. Consider:

$$\alpha L \Delta T = \Delta L$$

$$LiTaO_3 \Rightarrow (17 \text{ ppm/K})(50 \text{ mm})(150K) = 1.275 \times 10^{-4} \text{ m}$$

$$Si \Rightarrow (2.6 \text{ ppm/K})(50 \text{ mm})(150K) = 0.195 \times 10^{-4} \text{ m}$$

wherein:
  $\alpha$=coefficient of thermal expansion
  L=initial length (50 mm in each direction)
  $\Delta T$=temperature change
  $\Delta L$=length change Thus, while the silicon cap wafer and the device wafer are aligned at room temperature, at the elevated bonding temperature of 150 degrees above room temperature, the alignments across the two wafers would be misaligned or not be registered due to the difference in the physical expansion of the two substrate materials.

Figure 4:
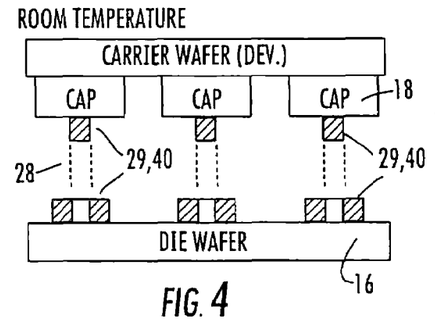
FIGS. 4 and 4A are partial diagrammatical elevation views illustrating an alignment of a cap with a device wafer using a carrier wafer at room temperature and at a bonding temperature, respectively.
Figure 4A:
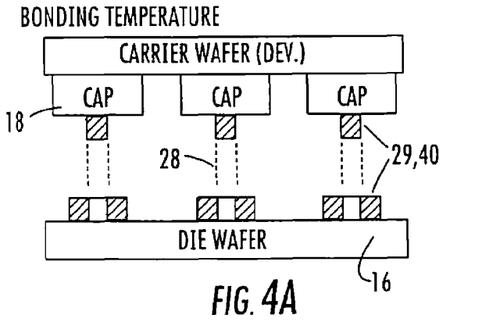
Figure 5:
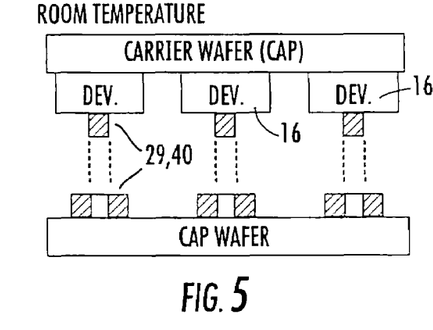
FIGS. 5 and 5A are partial diagrammatical elevation views illustrating an alignment of a device with a cap material using a carrier wafer at room temperature and at a bonding temperature, respectively.
Figure 5A:
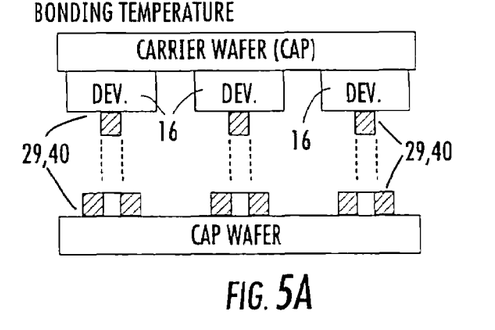
Figure 6:
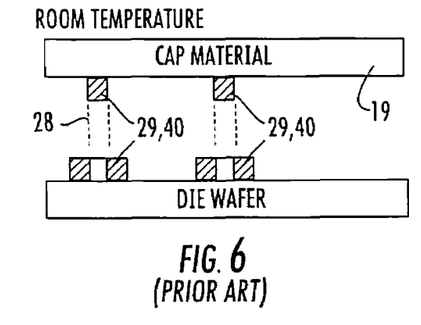
FIGS. 6 and 6A are partial diagrammatical elevation views illustrating typical misalignment of a cap material with a device wafer when a temperature is elevated from room temperature to a bonding temperature, respectively.
Figure 6A:
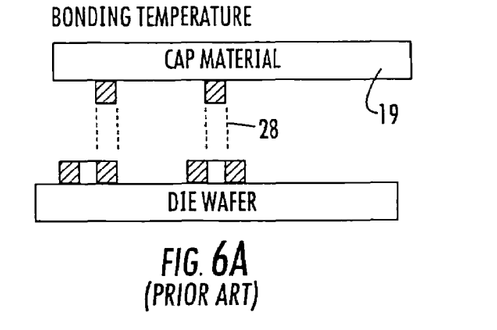

As will herein be described, by way of example for one embodiment of the present invention, thermal expansion mismatch may be mitigated by cutting the cap material to a final desired size before bonding the cap 18 with the device wafer 16. Prior to cutting, the cap material 19 may be temporarily, also referred to as reversibly, bonded to a carrier wafer 26 formed from a similar material or a material having a similar CTE as the device wafer 16. As a result, and as illustrated with reference to FIGS. 4–6, alignment, herein illustrated by alignment lines 28, and thus using marks 29 when bonding with an adhesive 30 as will later be described, by way of example, of individual or singulated caps 18 with the die or device wafer 16 is improved by temporarily bonding the cap material 19 prior to singulating into the caps 18, or alternatively, the device 12, from a device material 13 prior to singulating into the devices, to the carrier wafer 26, rather than attempting to bond the cap material 19 to the device wafer 16 directly prior to the singulating. As illustrated, FIG. 4 compares a structure at room temperature to the structure of FIG. 4A at a bonding temperature, and the like for FIGS. 5 and 6. As illustrated in FIGS. 6 and 6A, wherein the carrier wafer thermal coefficient expansion is similar to that of the device, the cap material is temporarily bonded to the carrier wafer and then it is singulated so that the expansion of each singulated individual cap component is controlled by the expansion of the carrier wafer. Similarly, in FIG. 5, the carrier wafer thermal coefficient of expansion is same or similar to that of the cap substrate, the device is temporarily bonded to the carrier wafer and singulated before being bonded to the cap.

Figure 7:
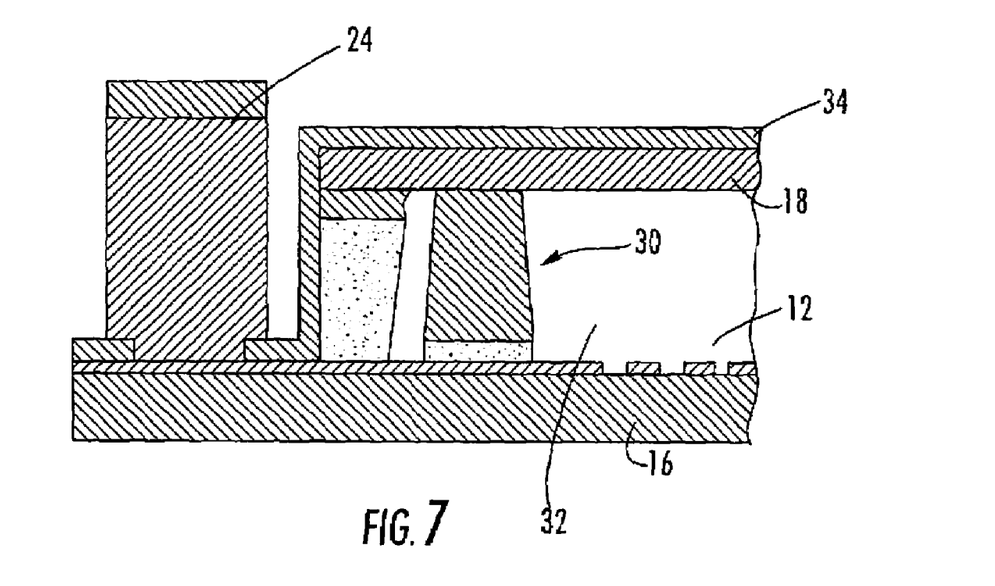
FIG. 7 is a partial cross-sectional elevation view of a SAW device encapsulated by a cap bonded to a device wafer.
Figure 8:
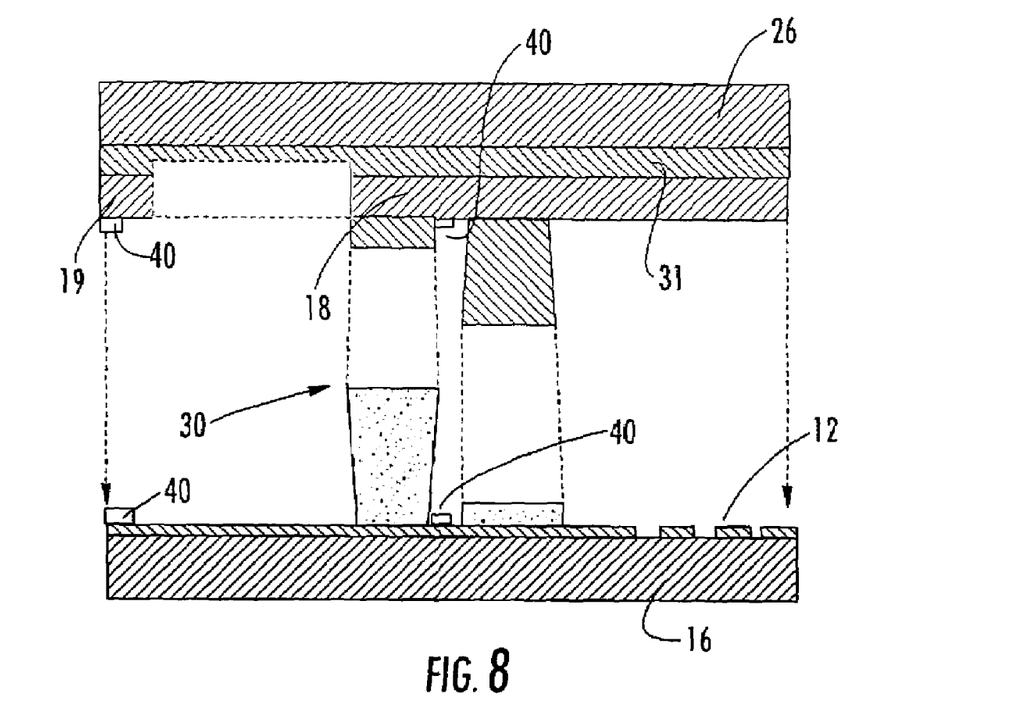
FIG. 8 is a partial cross-sectional elevation view illustrating the structure of FIG. 7 during an earlier processing step.

One embodiment of the present invention includes a method of assembling the package 10 earlier described with reference to FIG. 1, and will herein be described, by way of example, with reference initially to FIG. 7 illustrating, in a partial cut-away view, a SAW device 12 encapsulated within a cavity 32 formed by the cap 18 bonded to the device wafer 16 using the adhesive, all of which are then encapsulated within a passivation layer 34. One embodiment may include using a temporary bond material 31 for reversibly bonding a silicon cap material (wafer) 19 to a lithium tantalate carrier wafer 26, singulating the cap material to provide the individual caps 18, and using a polymer adhesive as the adhesive 30, and bonding the temporary cap assembly 36 to the device wafer 16 having the SAW device 12 carried thereon, as illustrated with reference to FIG. 8, by way of example.

Figure 9A:
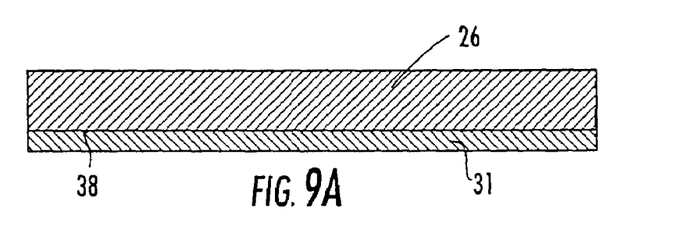
FIGS. 9A–9J are partial diagrammatical elevation views illustrating various steps in a process of manufacturing the package of FIGS. 1 and 7.
Figure 9B:
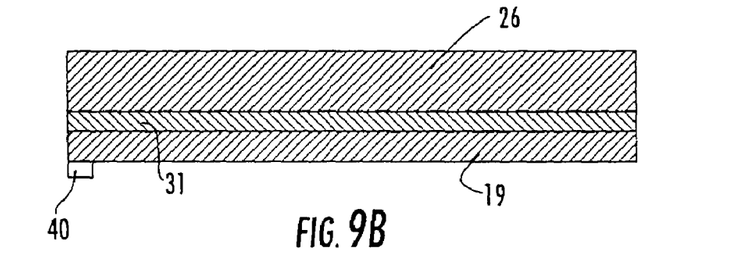
Figure 9C:
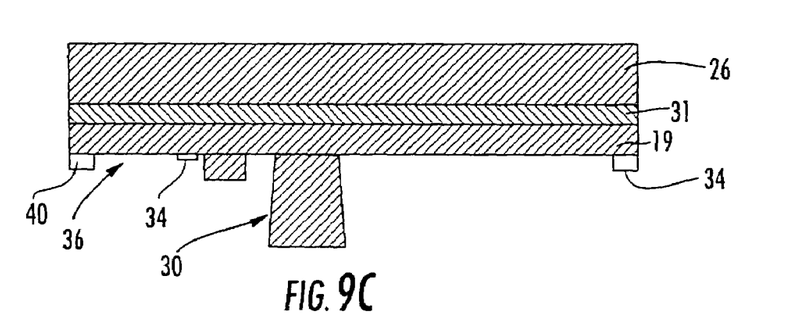
Figure 9D:
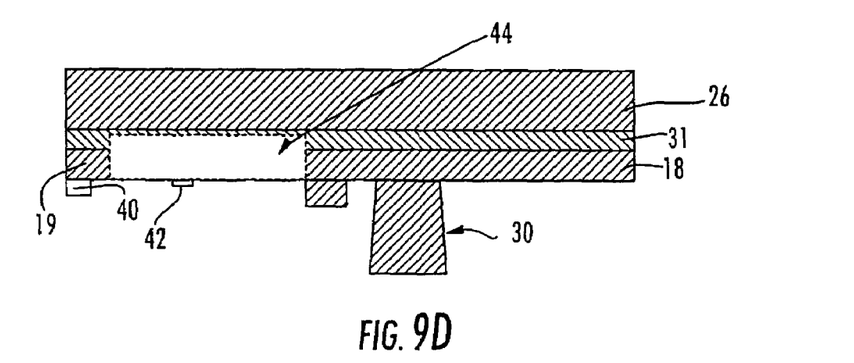

With reference now made to FIGS. 9A–9J, one process may include selecting the carrier wafer 26 of a material with a similar coefficient of thermal expansion as device wafer 16. By way of example, lithium tantalate may be used for the carrier wafer 26 if the device wafer 16 is made of a lithium tantalite material. A cap material 19 that is a low cost material may be used, such as silicon, glass, printed circuit board, ceramic circuit board, and the like. By way of example, the silicon cap wafer 19 may have a thickness of approximately 100 µm. As illustrated with reference to FIG. 9A, the temporary bond material 31 is applied to one surface 32 of the carrier wafer 26. As illustrated with reference to FIG. 9B, the cap material 19 is temporarily and reversibly bonded to the carrier wafer 26 using a reversible bonding technique. This allows the carrier wafer 26 to be re-usable, thus desirably lowering a cost of production. The bonding materials may be low melting temperature materials such as wax, solder, thermal; release tape, or materials that can be dissolved such as photoresist, polymer, or metal alloy. Optionally, with the cap material 19 bonded to the carrier wafer 26, the cap material may be thinned to further reduce the package height 14 or to further constrain the thermal expansion behavior to that of the carrier wafer. The carrier wafer 26 adds mechanical stability to the thinned cap material 19. With reference to FIG. 9C, pattern alignment elements 40 are deposited on the cap assembly 36 including the cap material 19 and on the carrier wafer 26 to ensure registry with the device wafer 16. As illustrated with reference to FIG. 9D, the cap material 19 is singulated while leaving the carrier wafer 26 generally intact. By way of example, singulation may comprise use of a wafer saw, reactive ion etch, ion milling, or wet chemical etching. Because the cap material 19 and the device wafer 16 have different coefficient of thermal expansion (CTE) values, they can be expected to expand to different lengths at the cap to device bonding temperature. As earlier described with reference to FIGS. 6 and 6A, the cap material 19 would move due to the cumulative effects of the entire cap material expanding. Singulating the cap material 19 to form the individual caps 18 results in many isolated caps that move or expand about their local center without influence of a neighboring material. Global registry between the devices 12 on the device wafer 16 and the corresponding individual cap 18 is now governed by the thermal expansion behavior of the carrier wafer 26. The gap 42 between individual caps 18 is formed by singulation trenches 44. The expansion of the individual caps 18 may now be controlled by the expansion of the intact carrier wafer 26. The dimensional change of the carrier wafer 26 is transferred through the temporary bond material 31 to the individual caps 18. Thus, registry between the individual cap 18 and the device 12 is ensured on a local scale. Optionally, the pattern depositing and the singulating may be adjusted depending on the cap-device bonding technique desired.

Figure 9E:
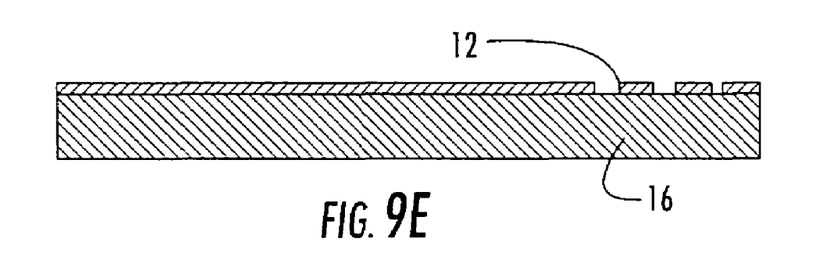
Figure 9F:
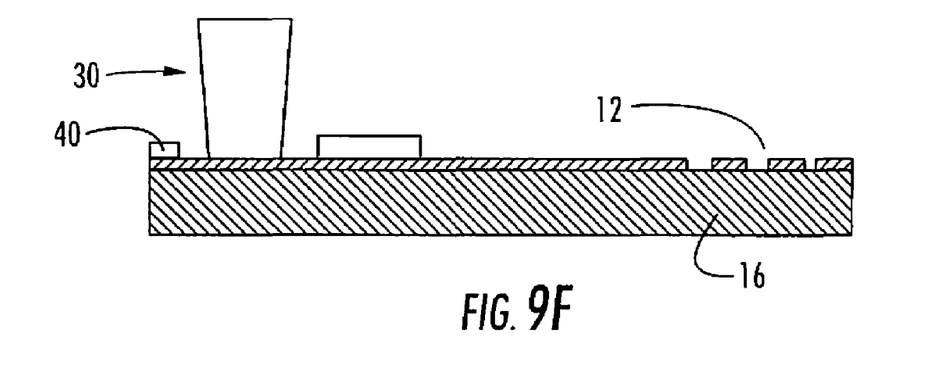
Figure 9G:
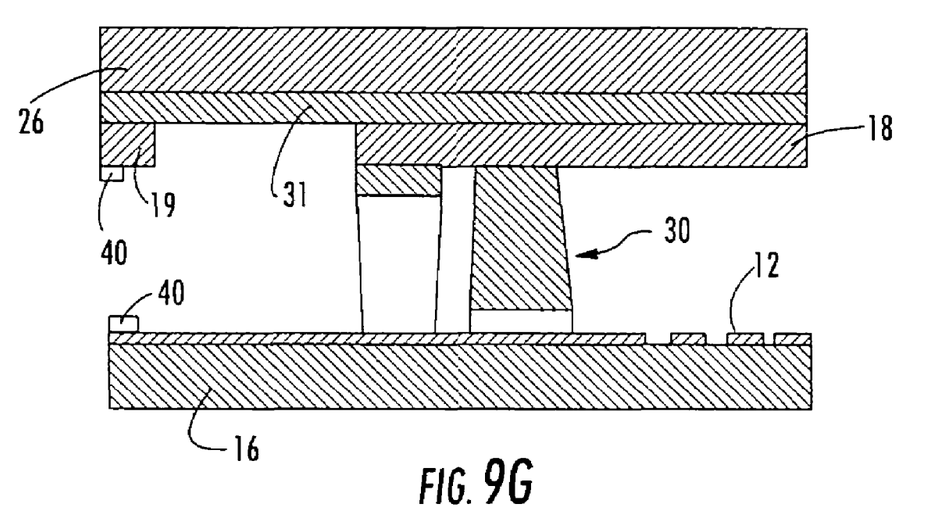
Figure 9H:
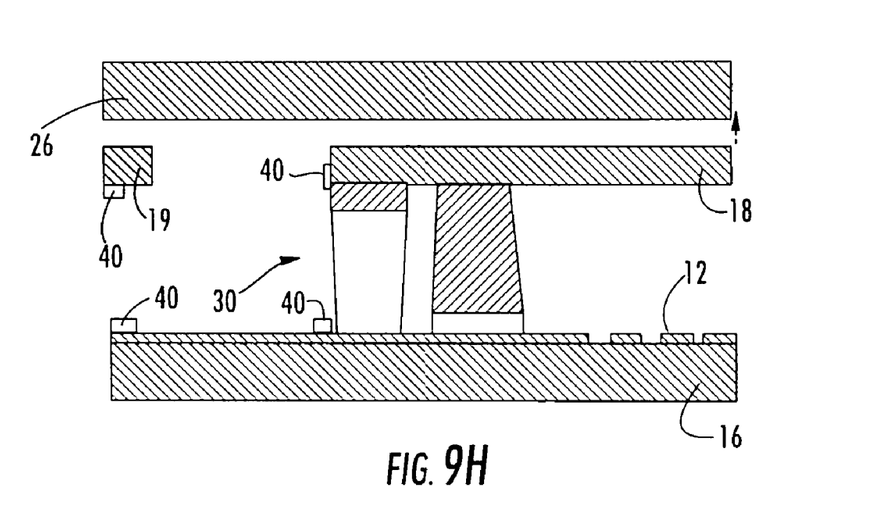
Figure 9I:
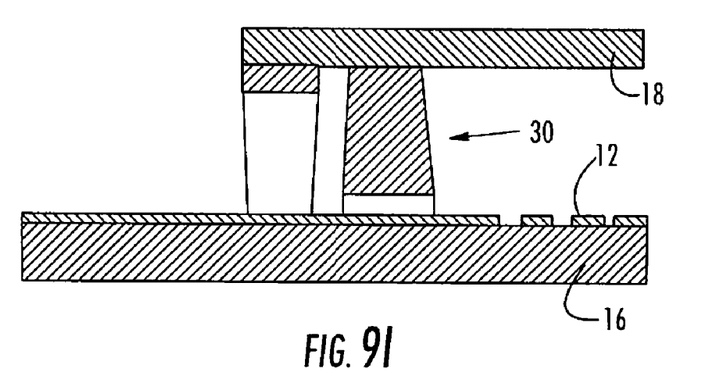

With reference to FIG. 9E, the device 12 may be fabricated on the device wafer 16 using conventional techniques. As illustrated with reference to FIG. 9F, as part of the device fabricating process or as a separate step, the pattern alignment elements 40 are applied for orienting the device wafer 16 with respect to the cap wafer assembly 36. With such as separate steps, additional bonding material may be deposited as needed to ensure desirable bond strength between the cap material 19 and the device wafer 16. The polymer adhesive 30 may have a height dimension of approximately 8–10 µm, by way of example. As illustrated with reference to FIG. 9G, the cap assembly 36 is then bonded to the device wafer 16 sufficiently to ensure good mechanical strength but not in such a manner to deteriorate the temporary bond material 31. Bonding may comprise a polymer adhesive bonding, a metal-metal cold welding, a solder bonding, eutectic bonding, and the like. With reference now to FIG. 9H, the carrier wafer 26 may be released from the cap assembly 36 using a reversible process appropriate for the temporary bond material. The carrier wafer 16 is removed as illustrated with reference to FIG. 9I, and may be cleaned and re-used within the process to keep costs low, as earlier stated.

Optionally, and as above described with reference to FIG. 5, the device wafer 16 may be temporarily bonded to the carrier wafer 26. This allows the device wafer 16 to be thinned to reduce the total package height 14. The carrier wafer 26 will provide mechanical stability to the device wafer 16 (wafer and material herein interchangeable used) during further processing. A device assembly 46 will undergo the above processing, as will now be appropriate depending on the cap material 19 to device material 16 bonding technique to be used. By way of such an example, the cap material 19 need not be temporarily bonded to its own carrier wafer. Further, the carrier wafer 26 and the cap material 19 have similar coefficients of thermal expansion. Even though the carrier wafer 26 is re-usable, this option allows a less expensive carrier material to be used. The cap material 19 will undergo process steps as above described for the pattern aligning.

Yet a further option may include having the cap material 19 temporarily bonded to a carrier wafer 26. This option allows both the cap material 19 and the device wafer 16 to be thinned, prior to applying the SAW transducer elements, so that the package height 14, earlier described with reference to FIG. 2, can be reduced as desired. Prior to permanently bonding the cap 18 to the device wafer 16, the devices 12 are singulated from each other.

Figure 9J:
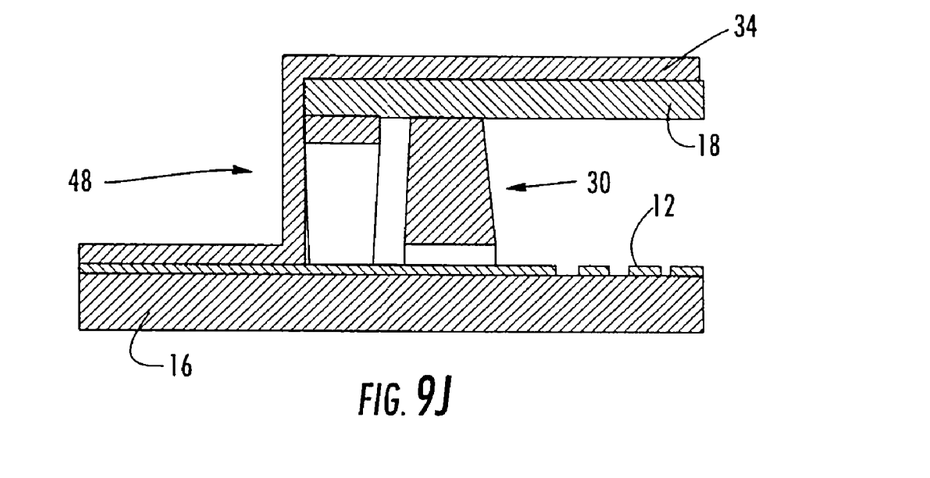

With reference to FIG. 9J, a dielectric overcoat such as the silicon dioxide passivation layer 34 earlier described may be added to the remaining assembly, upon which the electrical contacts 24 may be fabricated, using a copper plating process by way of example, on the now capped assembly 48 resulting in the desired embodiment illustrated with reference again to FIG. 7.

Figure 10A:
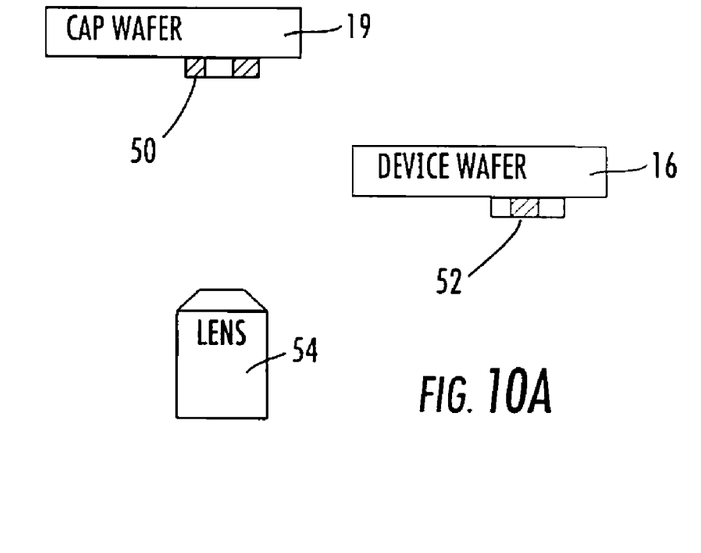
FIGS. 10A–10C are partial diagrammatical views illustrating an alignment process operable for the present invention.
Figure 10B:
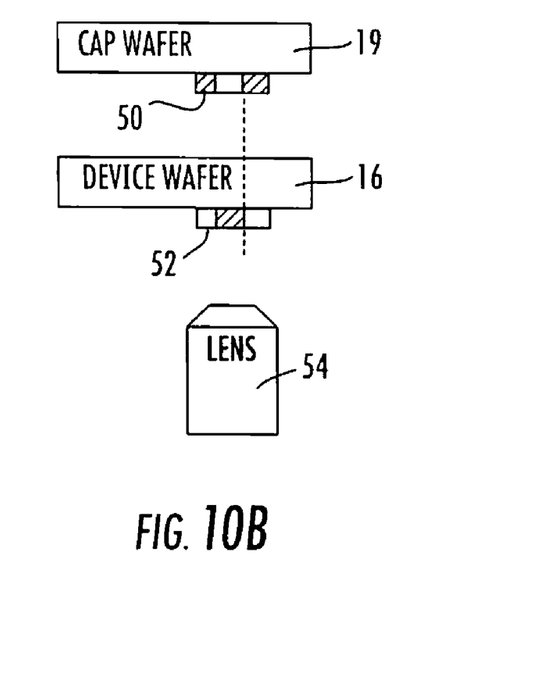
Figure 10C:
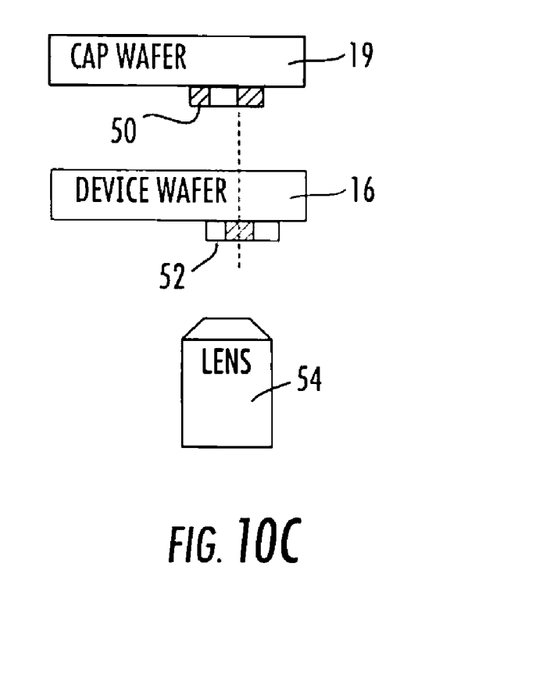

With regard now to alignment, by way of example and as above described with reference to FIGS. 4–6, by using the carrier wafer 26 with the singulated caps 18, the thermal expansion between the caps and the device 12 is consistent. An alignment at room temperature, before bonding, may be desirable. Methods of ensuring alignment at room temperature can vary depending on the type of alignment equipment being used, such as using a "backside alignment" procedure and alternatively, a "face-to-face alignment" method. With reference to FIGS. 10A–10C, when backside alignment is used, an alignment mark 50 may be formed on a front-side, a mating side, of one wafer 19. A second alignment mark 52 may be created on a backside of the opposing wafer 16. With the wafers 16, 19 mounted onto alignment equipment, an image may be captured by an optical device 54 using the alignment mark 50. The second wafer 16 is brought into the imaging area, as illustrated with reference to FIG. 10B, and the wafer 16 is maneuvered to align the marks 50, 52 as illustrated with reference to FIG. 10C on both wafers 16, 19.

By way of further example, there are several ways to align wafers using face-to-face alignment marks. One method may include separating the two wafers in the vertical direction and using an optical device support, and maneuvering one wafer relative to the other to align them. Another method may have the wafers separated in a lateral direction, aligning the wafers in the planar axes, and then bringing them into alignment vertically using a precision linear motion drive. If one of the wafers is transparent in other light wavelengths, infrared for example, then the wafers can be aligned with optics positioned like backside alignment but the IR optics will "see" through one wafer to image alignment marks created on the other side of the wafer.

Figure 11:
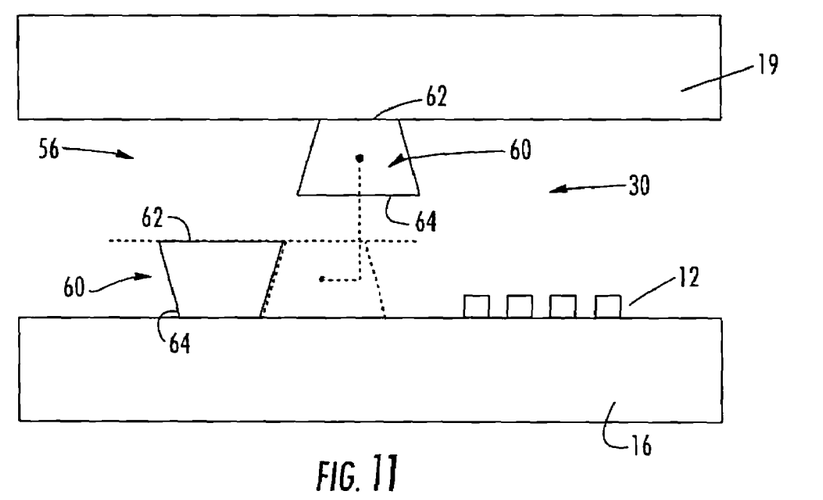
FIGS. 11 and 12 are partial elevation views illustrating locking bonding structures.
Figure 12:
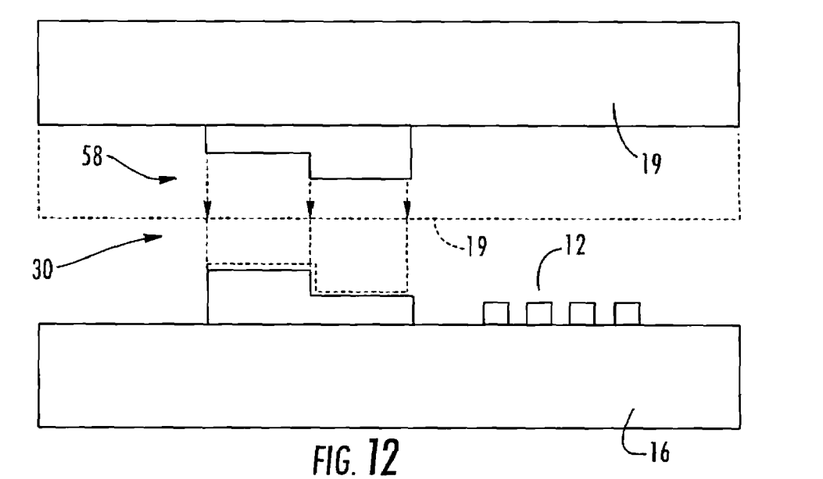

With regard to the adhesive 30 described earlier with reference to FIG. 7 and series of FIGS. 9A–9J, using a photoimageable polymer, such as a negative or a positive photoresist, photosensitive epoxies or other photosensitive adhesives, as an intermediate bonding material, the thermal mismatch between the device and low cost cap material can be accommodated using the above described process. As illustrated earlier, this may be achieved by extending one patterned polymer from each of the cap and the device wafer, whereby the material with the highest coefficient of thermal expansion has the wall farthest from the active area. Coating both materials with the same polymer results in the polymer acting as a planarizing layer over any topology on the device or cap material. A polymer-to-polymer bonding improves the adhesion between the cap and device material, and creates a mechanical interlock between the two polymer features. As will be appreciated by those skilled in the art, increased surface areas are formed for an improved bond. By way of example, a mechanical interlock can be achieved by using a "dove-tail" interlock 56, as illustrated earlier and now with reference to FIG. 11, and by a "step height" interlock 58, as illustrated with reference to FIG. 12.

With reference again to FIG. 11, the dovetail interlock 56 may include a polymer wall 60 having a negative wall profile such that the top 62 of the wall 60 is thicker than the bottom 64 of the wall. To create the negative wall profile, the photoresist may be a negative photoresist or a modified positive photoresist such that the exposed portion of the photoresist is not removed by a developing solution. Additionally, a focus depth of the exposing light source will be adjusted accordingly. As a result, as the wall 60 moves with the expanding material, the walls interlock by their dovetail nature. For the example illustrated with reference to FIG. 11, the device wafer 16 has a higher CTE that the cap material 19. Alternate embodiments and combinations will come to those of skill in the art, now having the benefit of the teachings of the present invention.

Figure 13:
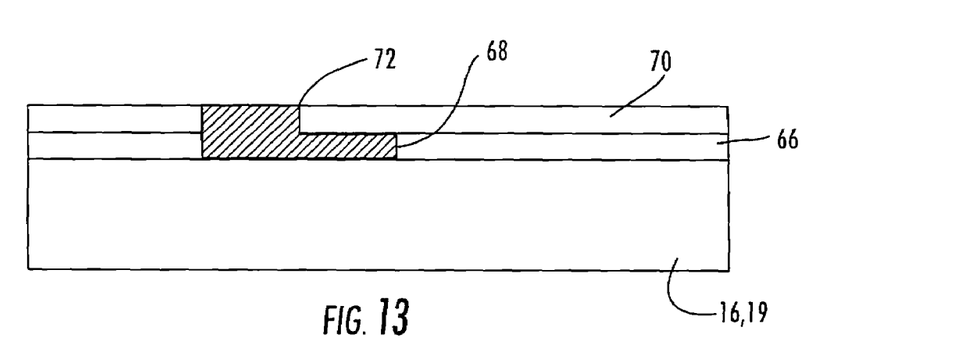
FIG. 13 is diagrammatical elevation view illustrating a photoresist method of forming the locking structure of FIG. 12.

As illustrated with reference again to FIG. 12, the step height interlock 58 may be constructed by multiple photoresist coatings. To create the step height interlock 58 by multiple coatings, a negative photoresist, or a modified positive photoresist, may be used whereby the exposed portion of the photoresist is not removed by a developing solution. With reference to FIG. 13, a first layer 66 of photoresist is coated onto the device wafer 16 or the cap material 19 and a bottom feature size 68 of the interlock 58 is exposed. Then another layer 70 of photoresist is coated onto the material and a second feature size 72 is exposed. Successive coatings and exposure cycles may be performed until the desired shape is achieved followed by a final immersion in a developing solution to remove any unexposed photoresist.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and alternate embodiments are intended to be included within the scope of the appended claims.

What is claimed is:

1. A wafer level package comprising:
   a piezoelectric device wafer having an acoustic wave device carried on a surface thereof;
   a cap formed from a cap material having a coefficient of thermal expansion significantly unequal to a coefficient of thermal expansion for the piezoelectric device wafer;
   a bond integrally connecting the cap to the piezoelectric device wafer for encapsulating the acoustic wave device thereby, wherein the bond comprises first and second bond portions, each extending from opposing surfaces of the cap and the piezoelectric device wafer, respectively, for providing an interlocking connection therebetween;
   a dielectric overcoat extending over the cap onto an exposed portion of the surface of the device wafer.

2. A package according to claim 1, wherein the device wafer comprises at least one of a lithium tantalite, lithium niobate, and a quartz material.

3. A package according to claim 1, wherein the cap material comprises at least one of silicon, glass, printed circuit board, and ceramic circuit board.

4. A package according to claim 1, wherein the device wafer comprises a lithium tantalate material, and wherein the cap material comprises at least one of silicon, glass, printed circuit board, and ceramic circuit board.

5. A package according to claim 1, wherein the bond comprises at least one of a polymer adhesive bonding, a metal-metal cold welding, a solder bonding, and a eutectic bonding.

6. A wafer level package comprising:
a piezoelectric device wafer having an acoustic wave device carried on a surface thereof;
a cap formed from a cap material having a coefficient of thermal expansion significantly unequal to a coefficient of thermal expansion for the piezoelectric device wafer; and
a bond integrally connecting the cap to the piezoelectric device wafer for encapsulating the acoustic wave device thereby, wherein the bond comprises first and second bond portions, each extending from opposing surfaces of the cap and the piezoelectric device wafer, respectively, for providing an interlocking connection therebetween, and wherein the first and second bond portions each comprise a dovetail shape bonded together for providing the interlocking connection.

7. A wafer level package comprising:
a piezoelectric device wafer having an acoustic wave device carried on a surface thereof;
a cap formed from a cap material having a coefficient of thermal expansion significantly unequal to a coefficient of thermal expansion for the piezoelectric device wafer; and
a bond integrally connecting the cap to the piezoelectric device wafer for encapsulating the acoustic wave device thereby, wherein the bond comprises first and second bond portions, each extending from opposing surfaces of the cap and the piezoelectric device wafer, respectively, for providing an interlocking connection therebetween, and wherein the first and second bond portions each comprise a step shape bonded together for forming the interlocking connection.

8. A package according to claim 1, wherein the bond comprises a photoimageable polymer formed by at least one of a negative or a positive photoresist, a photosensitive epoxy, and a photosensitive adhesive.

9. A package according to claim 1, further comprising an electrical contact carried by the device wafer external to the dielectric overcoat.

10. A package according to claim 9, wherein the electrical contact comprises a platted copper material.

11. A package according to claim 1, wherein the dielectric overcoat comprises a silicon dioxide passivation layer.

12. A package according to claim 1, wherein the bond comprises a low melting point temperature material of at least one of wax, solder, thermal release tape, and a dissolvable material.

13. A package according to claim 12, wherein the dissolvable material comprises at least one of a photoresist material, a polymer, and a metal alloy.

14. A package according to claim 1, further comprising alignment elements carried by the cap and the device wafer for aligning the cap with the device wafer during assembly.

15. A package according to claim 14, wherein the alignment elements comprise:
a first alignment mark on a front-side, a mating side, of at least one of the cap and the device wafer;
a second alignment mark on a backside of opposing device wafer.

16. A package according to claim 5, wherein the polymer adhesive comprises a height dimension of approximately 8–10 µm.

17. A package according to claim 6, wherein the bond comprises a photoimageable polymer formed by at least one of a negative or a positive photoresist, a photosensitive epoxy, and a photosensitive adhesive.

18. A package according to claim 6, wherein the bond comprises a low melting point temperature material of at least one of wax, solder, thermal release tape, and a dissolvable material.

19. A package according to claim 18, wherein the dissolvable material comprises at least one of a photoresist material, a polymer, and a metal alloy.

20. A package according to claim 6, wherein the bond comprises at least one of a polymer adhesive bonding, a metal-metal cold welding, a solder bonding, and a eutectic bonding.

21. A package according to claim 20, wherein the polymer adhesive comprises a height dimension of approximately 8–10 µm.

22. A package according to claim 7, wherein the bond comprises a photoimageable polymer formed by at least one of a negative or a positive photoresist, a photosensitive epoxy, and a photosensitive adhesive.

23. A package according to claim 7, wherein the bond comprises a low melting point temperature material of at least one of wax, solder, thermal release tape, and a dissolvable material.

24. A package according to claim 23, wherein the dissolvable material comprises at least one of a photoresist material, a polymer, and a metal alloy.

25. A package according to claim 7, wherein the bond comprises at least one of a polymer adhesive bonding, a metal-metal cold welding, a solder bonding, and a eutectic bonding.

26. A package according to claim 25, wherein the polymer adhesive comprises a height dimension of approximately 8–10 µm.

* * * * *